(12) United States Patent  (10) Patent No.: US 8,723,625 B2
Lee  (45) Date of Patent: May 13, 2014

(54) AMPLIFICATION CELL EMPLOYING LINEARIZATION METHOD AND ACTIVE INDUCTOR USING THE SAME

(75) Inventor: Young Jae Lee, Daegu (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 734 days.

(21) Appl. No.: 12/971,159

(22) Filed: Dec. 17, 2010

(65) Prior Publication Data

US 2011/0148528 A1    Jun. 23, 2011

(30) Foreign Application Priority Data

Dec. 18, 2009  (KR) ......................... 10-2009-0127513
Nov. 17, 2010  (KR) ......................... 10-2010-0114571

(51) Int. Cl.
*H03H 11/00*  (2006.01)
*H03H 11/42*  (2006.01)

(52) U.S. Cl.
USPC ......................................... 333/213; 333/216

(58) Field of Classification Search
CPC ....... H03F 3/195; H03F 1/0288; H03H 11/46;
H03H 11/48; H03H 11/52; H03H 11/42;
H03B 5/12
USPC ............... 333/213–217; 330/124 R, 295, 149
See application file for complete search history.

(56) References Cited

U.S. PATENT DOCUMENTS 6,252,461 B1 *  6/2001  Raab ............................ 330/302
6,577,212 B1 *  6/2003  Mattisson et al. ............ 333/215
7,030,714 B2 *  4/2006  Korol ........................... 333/124
7,042,317 B2     5/2006  Xiao et al.
7,573,332 B1 *  8/2009  Kase ............................. 330/253
2006/0001504 A1 *  1/2006  Singh et al. ................. 333/28 R
2009/0033440 A1  2/2009  Masuda et al.

FOREIGN PATENT DOCUMENTS

JP         2008-187654 A        8/2008

OTHER PUBLICATIONS

Mahmoudi et al., 8 GHz Tunable CMOS Quadrature Generator using Differential Active Inductors, IEEE ISCAS 2005, pp. 2112-2115.
Xiao et al., A Radio-Frequency CMOS Active Inductor and Its Application in Designing High-Q Filters, IEEE ISCAS 2004, pp. 197-200.

* cited by examiner

*Primary Examiner* — Dean O Takaoka
*Assistant Examiner* — Alan Wong
(74) *Attorney, Agent, or Firm* — Rabin & Berdo, P.C.

(57) ABSTRACT

An amplification cell employing a linearization scheme and an active inductor using the same are provided. The active inductor includes: first and second amplification cells each including a main amplifying unit amplifying an input signal, an auxiliary amplifying unit connected in parallel to the main amplifying unit and eliminating nonlinear characteristics of the main amplifying unit while amplifying the input signal, and a negative load unit connected to an output terminal of the main amplifying unit and that of the auxiliary amplifying unit; a plurality of load resistors for tuning frequency; and a plurality of capacitors for tuning frequency, wherein an output from the first amplification cell is negatively fed back to the second amplification cell, an output from the second amplification cell is negatively fed back to the first amplification cell, and the plurality of load resistors and the plurality of capacitors are disposed on negative feedback paths of the first and second amplification cells.

16 Claims, 11 Drawing Sheets

AMPLIFICATION CELL EMPLOYING LINEARIZATION METHOD AND ACTIVE INDUCTOR USING THE SAME

CROSS-REFERENCE TO RELATED APPLICATIONS

This application claims the priority of Korean Patent Application Nos. 10-2009-0127513 filed on Dec. 18, 2009 and 10-2010-0114571 filed on Nov. 17, 2010, in the Korean Intellectual Property Office, the disclosures of which are incorporated herein by reference.

BACKGROUND OF THE INVENTION

1. Field of the Invention

The present invention relates to an active inductor and, more particularly, to a cell having improved linearity by employing a linearization scheme and a structure of an active inductor using the same.

2. Description of the Related Art

FIGS. 1A and 1B are views illustrating the structure of the related art active inductor.

With reference to FIG. 1A, the related art active inductor has the structure of a gyrator-C. The gyrator-C may be implemented by connecting inputs of two amplifiers 100 to outputs of the counterparts such that they are reversed with relation to each other. FIG. 1B shows an equivalent circuit formed by adding output resistors ($r_{o1}$, $r_{o2}$) and capacitors ($C_1$, $C_2$) to the structure of FIG. 1A.

An input impedance Y(s) of the circuit illustrated in FIG. 1A may be obtained as represented by Equation 1 shown below:

$$Y(s) = sC_2 + \frac{1}{r_{o2}} + \frac{1}{s\frac{C_1}{g_{m1}g_{m2}} + \frac{1}{g_{m1}g_{m2}r_{o1}}} \qquad \text{[Equation 1]}$$

Here, $g_{m1}$ and $g_{m2}$ are trans-conductances of an inverting amplifier.

In comparison between Equation 1 and the equivalent circuit illustrated in FIG. 1B, an equivalent parallel resistance Rp, an equivalent parallel capacitor Cp, an equivalent serial resistance Rs, and an equivalent inductor (L) can be expressed as shown Equation below:

$$R_p = r_{o2}, \ C_p = C_2, \qquad \text{[Equation 2]}$$
$$L = \frac{C_1}{g_{m1}g_{m2}}, \ R_s = \frac{1}{g_{m1}g_{m2}r_{o1}}$$

As noted from Equation 2, as the equivalent parallel capacitance Cp is reduced, the resonant frequency of the inductor is increased, so $C_2$ must therefore become small. Also, when $g_{m1}$ and $g_{m2}$ are reduced and the value C1 is increased, the inductance of the equivalent inductor (L) is increased. Then, the equivalent serial resistance Rs would increase to degrade a Q value of the inductor (L). Thus, in order to improve this problem, resistances $r_{o1}$ and $r_{o2}$ must be large. Thus, a circuit in which the two resistances $r_{o1}$ and $r_{o2}$ are large is required, and this is made possible by using a negative resistance circuit.

FIGS. 2A and 2B are circuit diagrams of the related art negative resistance circuit.

With reference to FIG. 2A, a negative resistance circuit 200 includes two NMOSs M3 and M4 and a resistor R.

With reference to FIG. 2B, the negative resistance circuit 200 may be expressed as an equivalent circuit by using equivalent circuits ($g_{m4}V_1$, $g_{m3}V_2$) of the NMOSs M3 and M4, and input impedance $Z_i$ in this case may be represented by Equation 3 shown below:

$$Z_i = -\frac{R\left(\frac{1}{g_{m3}} + \frac{1}{g_{m4}}\right)}{R - \left(\frac{1}{g_{m3}} + \frac{1}{g_{m4}}\right)} = R \mathbin{/\mkern-5mu/} \left[-\left(\frac{1}{g_{m3}} + \frac{1}{g_{m4}}\right)\right] \qquad \text{[Equation 3]}$$

Values $g_{m3}$ and $g_{m4}$ are trans-conductances of the inverting amplifier, respectively.

With reference to Equation 3, a high Q value of the inductor (L) can be obtained by adjusting the resistance value R and the trans-conductance values $g_{m3}$ and $g_{m4}$ of the NMOSs such that the denominator term becomes 0.

FIGS. 3A and 3B show structures of the related art active inductor.

With reference to FIG. 3A, the active inductor is configured to have a structure of a gyrator-C using two differential amplification cells 300 including negative resistance and capacitors. However, the active inductor has a fatal flaw in having nonlinearity, because of the nonlinearity of the amplification cells 300.

With reference to FIG. 3B, when an input voltage swing of differential inputs (Input +/−) is increased in the amplifying circuits, the $g_m$ value of the transistor is affected. Then, a negative resistance value of an equivalent resistance in the negative resistance circuit connected to a load of a common-source amplifier using a PMOS as an active load is changed to cause the inductance (L) to be changed as noted from Equation 2, resultantly making the circuit nonlinear.

SUMMARY OF THE INVENTION

An aspect of the present invention provides an amplification cell insensitive to the amplitude of an input voltage by employing a linearization scheme, thus improving linearity, and an active inductor using the same.

According to an aspect of the present invention, there is provided an amplification cell including: a main amplifying unit amplifying an input signal; an auxiliary amplifying unit connected in parallel to the main amplifying unit and eliminating nonlinear characteristics of the main amplifying unit while amplifying the input signal; and a negative load unit connected to an output terminal of the main amplifying unit and that of the auxiliary amplifying unit.

According to another aspect of the present invention, there is provided an active inductor including: first and second amplification cells each including a main amplifying unit amplifying an input signal, an auxiliary amplifying unit connected in parallel to the main amplifying unit and eliminating nonlinear characteristics of the main amplifying unit while amplifying the input signal, and a negative load unit connected to an output terminal of the main amplifying unit and that of the auxiliary amplifying unit; a plurality of load resistors for tuning frequency; and a plurality of capacitors for tuning frequency, wherein an output from the first amplification cell is negatively fed back to the second amplification cell, an output from the second amplification cell is negatively fed back to the first amplification cell, and the plurality of load resistors and the plurality of capacitors are disposed on negative feedback paths of the first and second amplification cells.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1A:
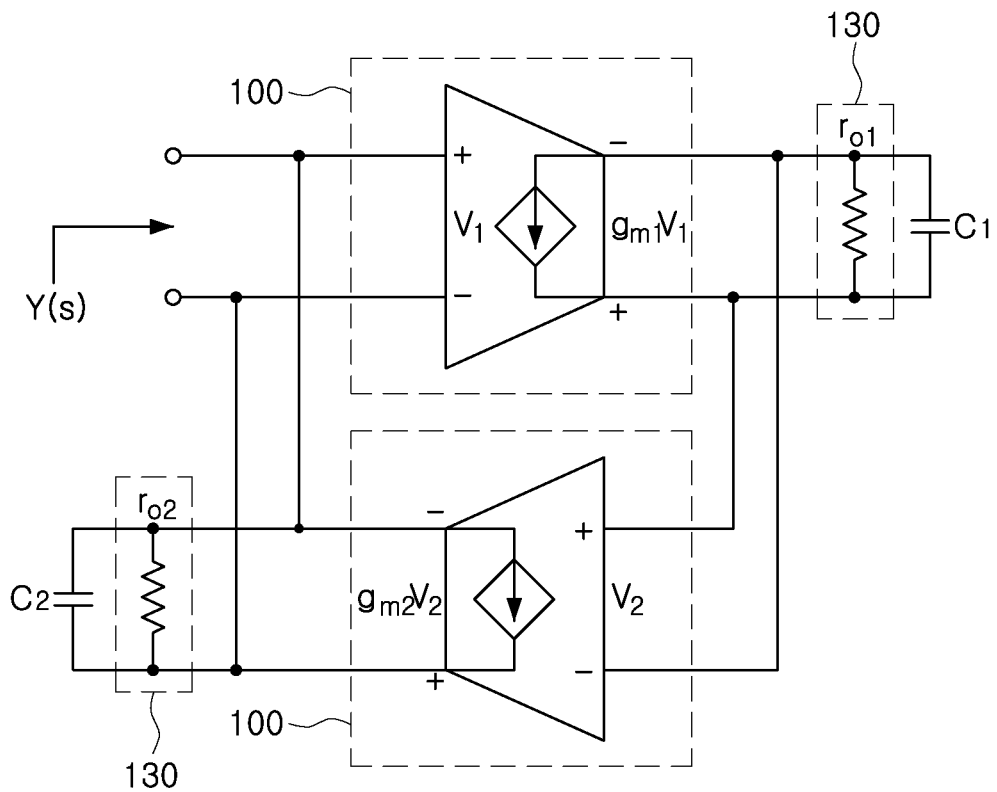
FIGS. 1A and 1B are views illustrating the structure of a related art active inductor.
Figure 1B:
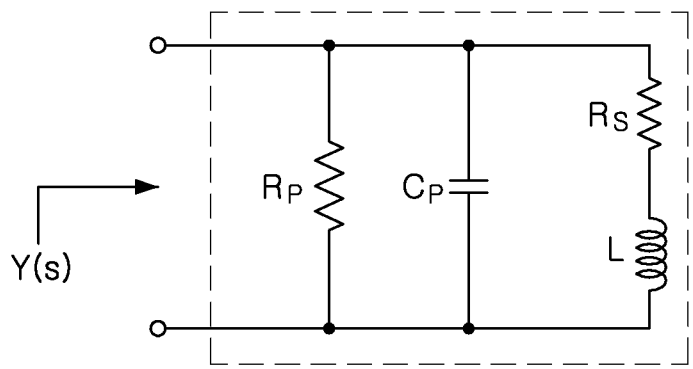
Figure 2A:
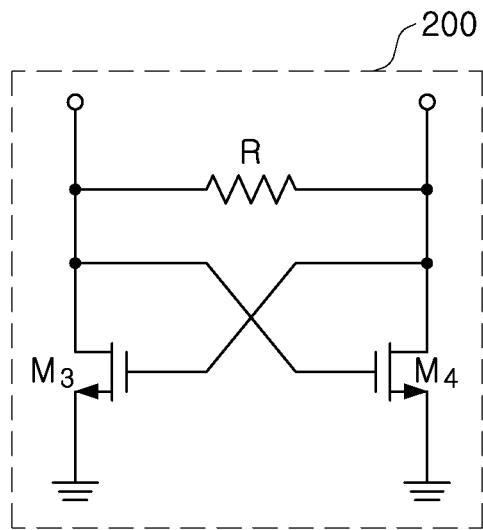
FIGS. 2A and 2B are circuits diagram of a related art circuit implementing negative resistance.
Figure 2B:
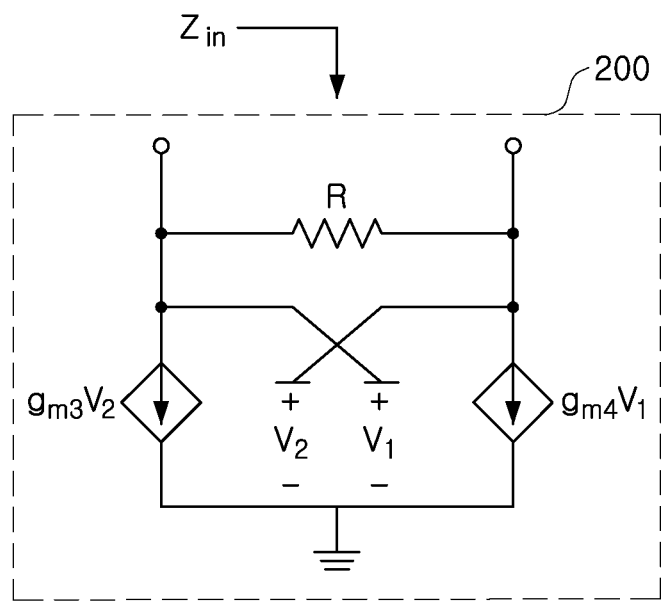

Exemplary embodiments of the present invention will now be described in detail with reference to the accompanying drawings. The invention may, however, be embodied in many different forms and should not be construed as being limited to the embodiments set forth herein. Rather, these embodiments are provided so that this disclosure will be thorough and complete, and will fully convey the scope of the invention to those skilled in the art.

In the drawings, the shapes and dimensions may be exaggerated for clarity, and the same reference numerals will be used throughout to designate the same or like components.

Unless explicitly described to the contrary, the word "comprise" and variations such as "comprises" or "comprising," will be understood to imply the inclusion of stated elements but not the exclusion of any other elements.

Figure 4:
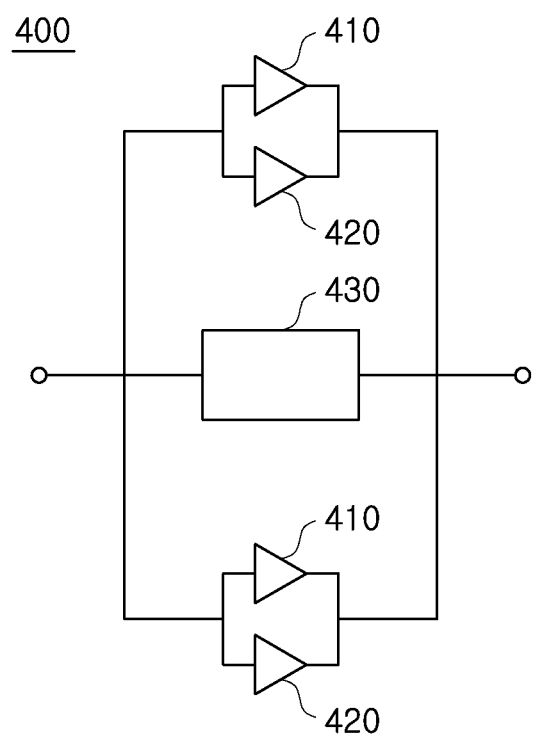
FIG. 4 is a function block diagram of an amplification cell employing a linearization scheme according to an exemplary embodiment of the present invention.

FIG. 4 is a function block diagram of an amplification cell employing a linearization scheme according to an exemplary embodiment of the present invention.

With reference to FIG. 4, an amplification cell 400 employing a linearization scheme according to an exemplary embodiment of the present invention may be configured to include a main amplifying unit 410, an auxiliary amplifying unit 420, and a negative resistor unit 430.

The main amplifying unit 410 and the auxiliary amplifying unit 420 are disposed to be parallel, and the negative resistance unit 430 receives a signal formed as output signals from the main amplifying unit 410 and the auxiliary amplifying unit 420 are synthesized. The main amplifying unit 410 serves to amplify an input signal, and the auxiliary amplifying unit 420 serves to eliminate nonlinear characteristics of the main amplifying unit to thus increase linearity of the amplification cell 400. To this end, the main amplifying unit 410 and the auxiliary amplifying unit 420 have different amplification characteristics and bias characteristics.

An MGTR (Multiple Gated Transistor) may be used as the auxiliary amplifying unit 420 that performs the foregoing function. When the main amplifying unit 410 and the auxiliary amplifying unit 420 are designed with the MGTR, an area of a certain portion of the amplifying units can be enlarged to improve linearity.

Figure 5A:
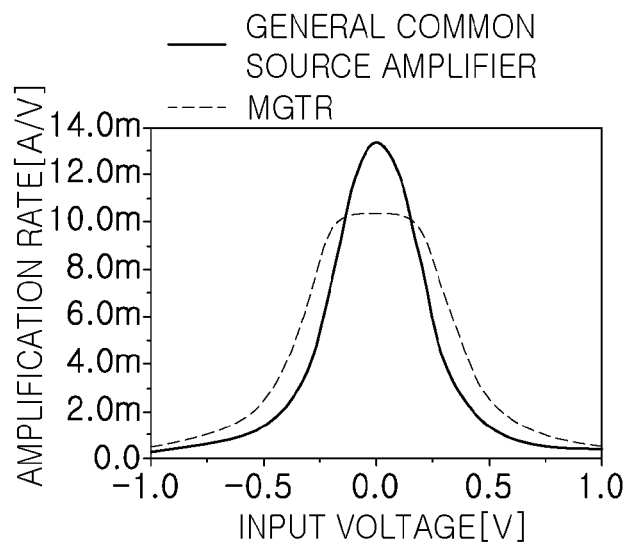
FIGS. 5A, 5B and 5C are graphs comparatively showing the characteristics of a general common source amplifier and those of a common source amplifier implemented to have MGTRs (Multiple Gated Transistors)
Figure 5B:
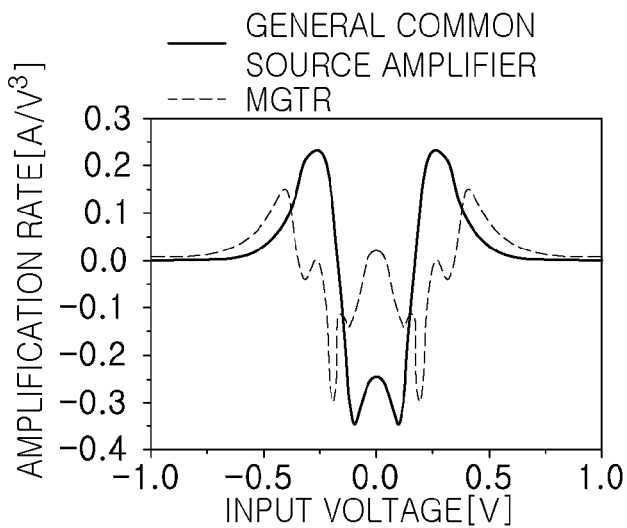

With reference to FIGS. 5A and 5B, the trans-conductance according to an input voltage switch, and changes in secondary differential values of the trans-conductance when a general common source amplifier and the MGTR amplifier are configured as differential circuits, can be noted. It is noted that when an amplifier is designed as an MGTR, it has a lower trans-conductance at a bias point than that of a general common source amplifier but is more insensitive to swings of input voltage. Also, as for the secondary differential value component, it is noted that the bandwidth of ripples thereof extends as the vibration amplitude of the ripples is reduced. Thus, when the trans-conductance according to the swing of the input voltage and the second differential value of the trans-conductance are collectively counted, it can be confirmed that the secondary differential value of the trans-conductance fortifies the linearity within the range in which the value of the trans-conductance is linearized.

The negative resistance unit 430 serves as a resistor having negative (−) resistance value characteristics. In general, preferably, the amplifying units 410 and 420 and the negative resistance unit 430 are designed simultaneously, because they may affect each other. Also, in general, the negative resistance unit 430 is implemented by using active elements, rather than passive resistors.

However, the related art negative resistance has a low linearity because the characteristics thereof are changed according to frequency.

Figure 5C:
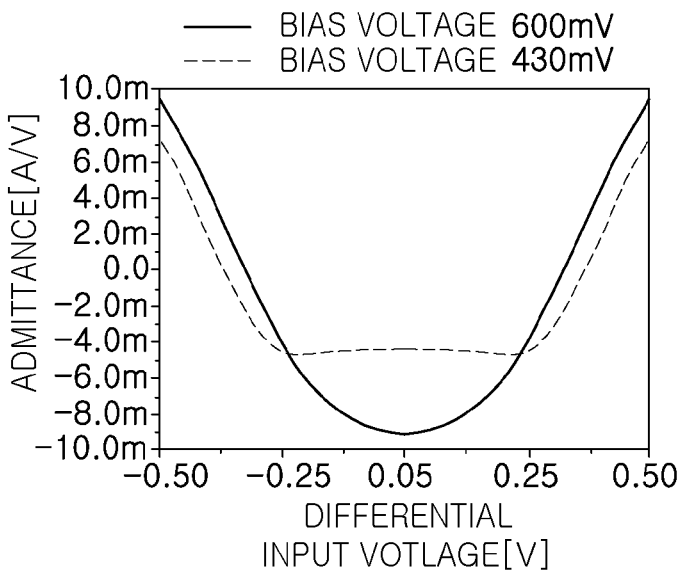

FIG. 5C is a graph showing admittance of the general negative resistance and that of the negative resistance proposed by the present invention over the swing of the input voltage. With reference to FIG. 5C, it is noted that the admittance of the related art negative resistance (bias voltage 630 mV) changes over the switching of the input voltage.

Also, when the amplification cell 100 is implemented by employing the related art negative resistance unit 200 as it is, because the current is shared, the excellent linear characteristics of the MGTR used for the amplifying unit are degraded.

Thus, in the negative resistance unit 430 according to an exemplary embodiment of the present invention, the bias voltage is maintained to be at a value barely exceeding a threshold voltage $V_T$, thus moving up an OFF time (i.e., an OFF point in time) of the transistor. When the OFF time is moved up, the admittance curved line of the negative resistance unit 430 is outwardly inclined to form a smooth portion at the admittance curved line (namely, an interval where the admittance characteristics are linear), thus implementing excellent negative resistance unit 430.

Figure 6:
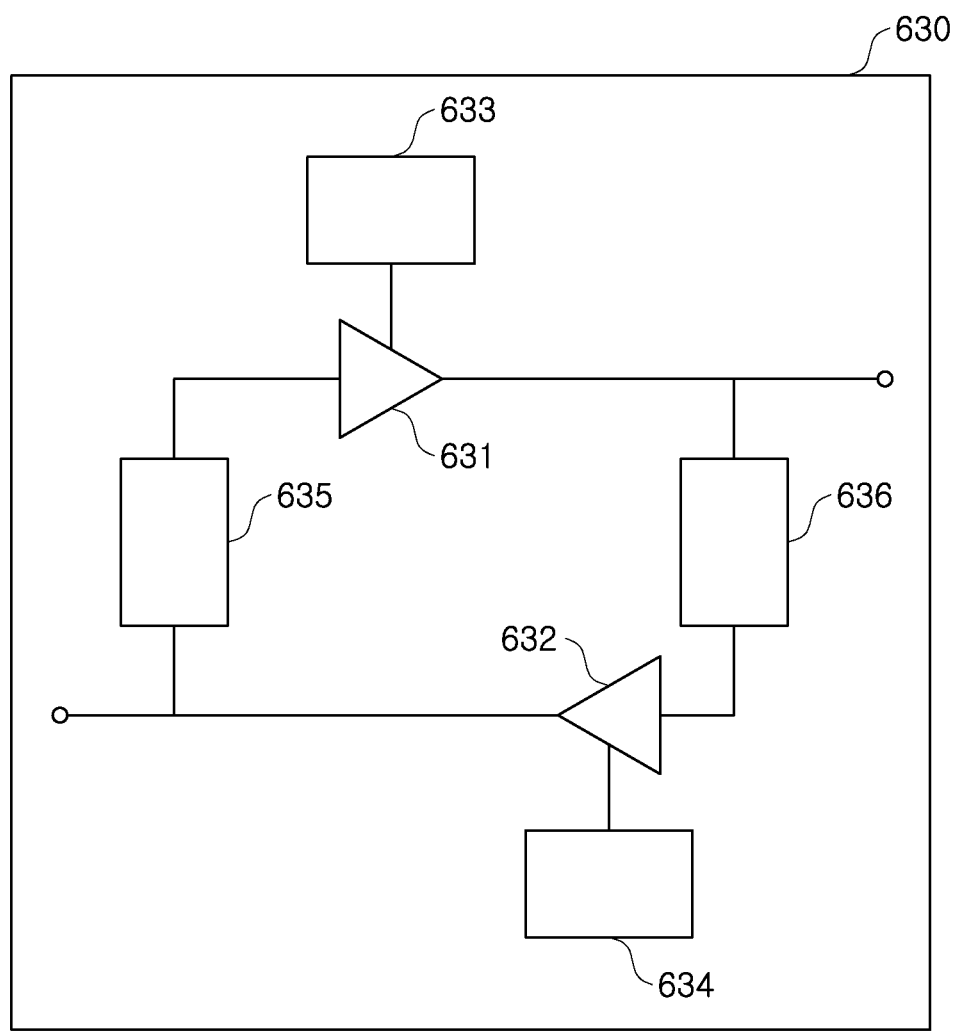
FIG. 6 is a function block diagram of the configuration of a negative resistance unit of an amplification cell according to an exemplary embodiment of the present invention.

FIG. 6 is a function block diagram of the configuration of a negative resistance unit of an amplification cell according to an exemplary embodiment of the present invention.

With reference to FIG. 6, a negative resistance unit 630 according to the present exemplary embodiment may be configured to include a first inverting amplifier 631, a second inverting amplifier 632, a first biasing unit 633, and a second biasing unit 634. The negative resistance unit 630 may further include first and second DC component eliminators 634 and 636. The negative resistance unit 630 illustrated in FIG. 6 inputs and outputs signals through two terminals for a differential circuit.

The first and second inverting amplifiers 631 and 632 amplify an input signal and output the amplified signal, respectively. The output from the first inverting amplifier is input to the second inverting amplifier, and the output from the second inverting amplifier is input to the first inverting amplifier. Namely, the inverting amplifiers are disposed in an annular form and amplify and output input signals, thus having negative (−) resistance value characteristics.

The first and second biasing units 633 and 634 are separately provided to prevent the biases of the first and second inverting amplifiers 631 and 632 from being changed due to the current otherwise shared with the amplification cell circuit, thereby improving the linearity of the negative resistance unit 630. The first and second biasing units 633 and 6334 control the first and second inverting amplifiers 631 and 632 according to the operation ranges of the negative resistance unit 630 and the amplification cell 400.

Unlike the existing negative resistance, the negative resistance unit 630 according to the present exemplary embodiment includes the biasing units 633 and 634 for regulating bias, so the bias points of the first and second inverting amplifiers 631 and 632 can be prevented from being destabilized.

The first and second DC component eliminators 635 and 636 eliminate an AC component of a signal shared with the active cell 400 and that of a signal transmitted between the first and second inverting amplifiers 631 and 632. Accordingly, the bias at both terminals of the negative resistance unit 630 can be stabilized.

Figure 7:
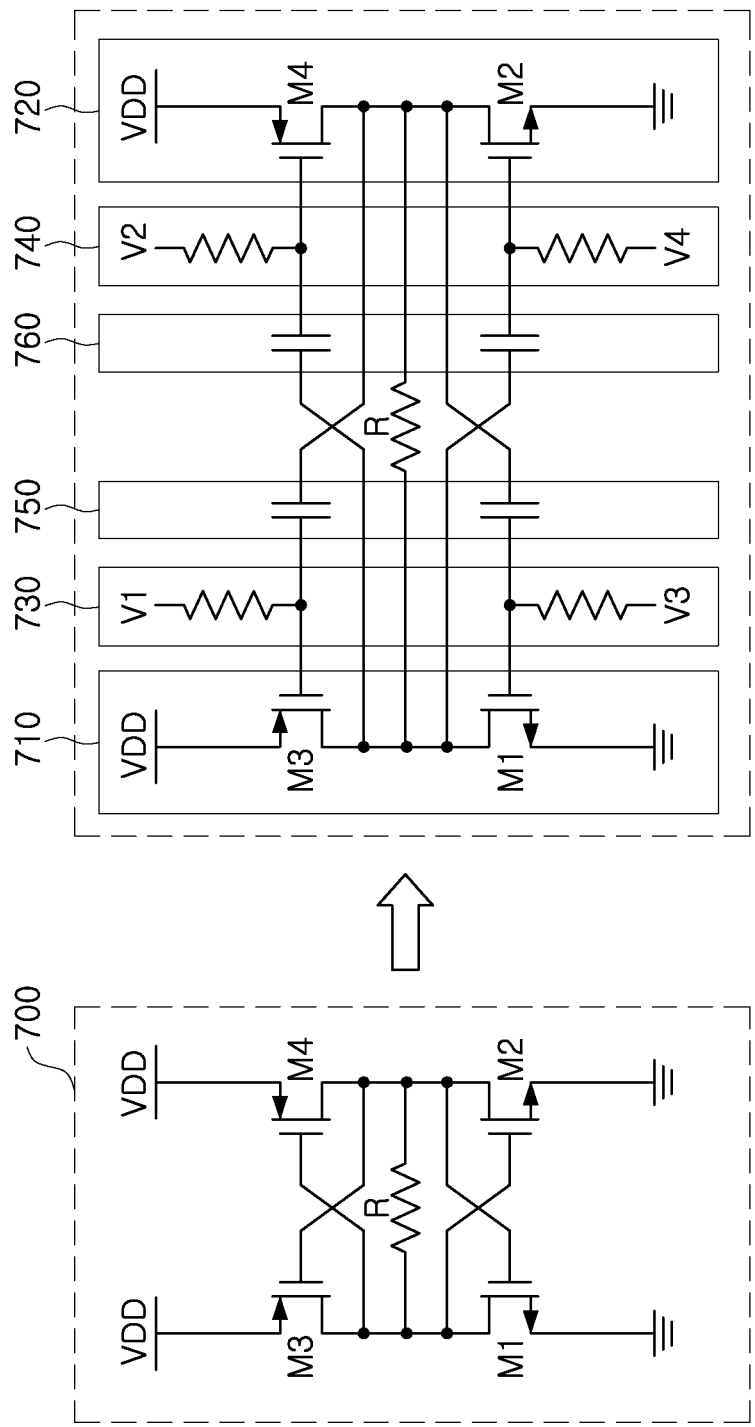
FIG. 7 is a circuit diagram of an implementation of a negative resistance unit of an amplification cell according to an exemplary embodiment of the present invention.

FIG. 7 is a circuit diagram of an implementation of a negative resistance unit of an amplification cell according to an exemplary embodiment of the present invention.

With reference to FIG. 7, first and second amplifiers 710 and 720 may be designed as class AB type amplifiers. Because the amplifiers are implemented as CMOS common source amplifiers, they invert an input signal and amplify it. Also, because the first and second amplifiers 710 and 720 are designed as class AB type amplifiers, they have a push-pull structure, improving linearity.

First and second biasing units 730 and 740 independently regulate bias. Accordingly, there is no current shared by the first and second amplifiers 710 and 720, thus improving the linearity of the negative resistance unit 630. In the circuit illustrated in FIG. 7, because the first and second inverting amplifiers 710 and 720 are designed with CMOS, the first and second biasing units 730 and 740 are designed to independently set bias with respect to each MOSFET. Namely, the potentials of V1, V2, V3, and V4 are independently set.

A first DC signal eliminator 750 eliminates a DC component existing in a signal received from the second inverting amplifier 720 in order to prevent the DC component from affecting the bias set in the first inverting amplifier 710 and thus also a dynamic range of the first inverting amplifier 710, thereby improving the linearity of the negative resistance unit.

The load (R) applies feedback between the first and second inverting amplifiers 710 and 720, operating as a negative resistance.

Figure 8:
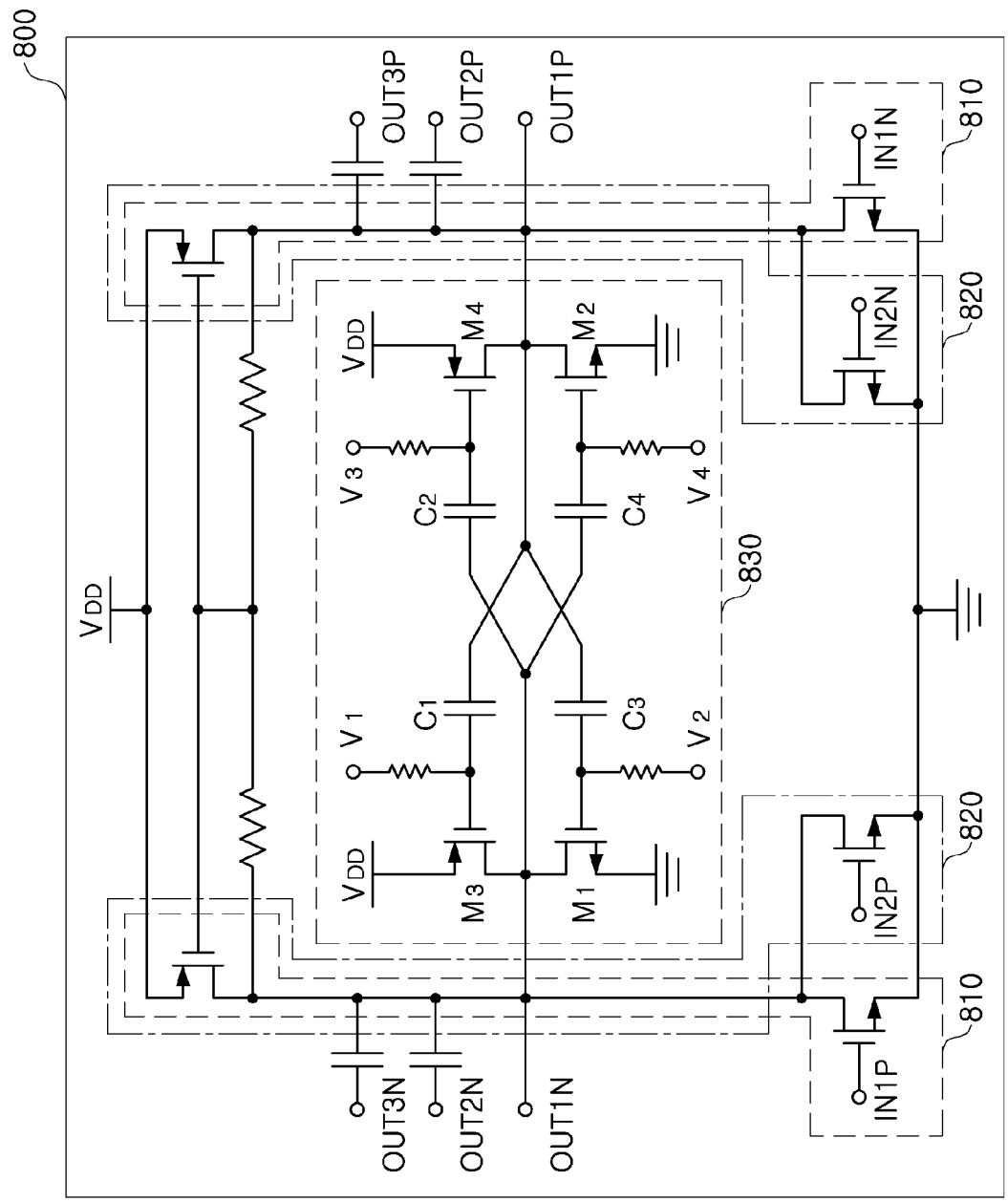
FIG. 8 is a circuit diagram of an amplification cell according to an exemplary embodiment of the present invention.

FIG. 8 is a circuit diagram of an amplification cell according to an exemplary embodiment of the present invention.

With reference to FIG. 8, an amplification cell 800 according to the present exemplary embodiment is implemented as a differential circuit, and differential signals are processed into signals IN1P, IN2P, IN1N, and IN2N for a main amplifying unit 810 and an auxiliary amplifying unit 820 and then input.

Two out of six differential output signal terminals (or ports) OUT1P, OUT2P, OUT3P, OUT1N, OUT2N, and OUT3N are connected to an external circuit, and the other four remaining output signal terminals are used as terminals for a connection of the amplification 800 in order to configure an active inductor.

Because the amplification cell 800 according to the present exemplary embodiment include the main amplifying unit 810, the auxiliary amplifying unit 820, and a negative resistance unit 830 having an independent biasing unit, it can have an improved linearity compared with the related art amplification cell. Thus, an implementation of an active inductor by using the amplification cell 800 according to the present exemplary embodiment would lead to obtaining an active inductor having excellent linearity without being affected by an input signal.

Figure 9:
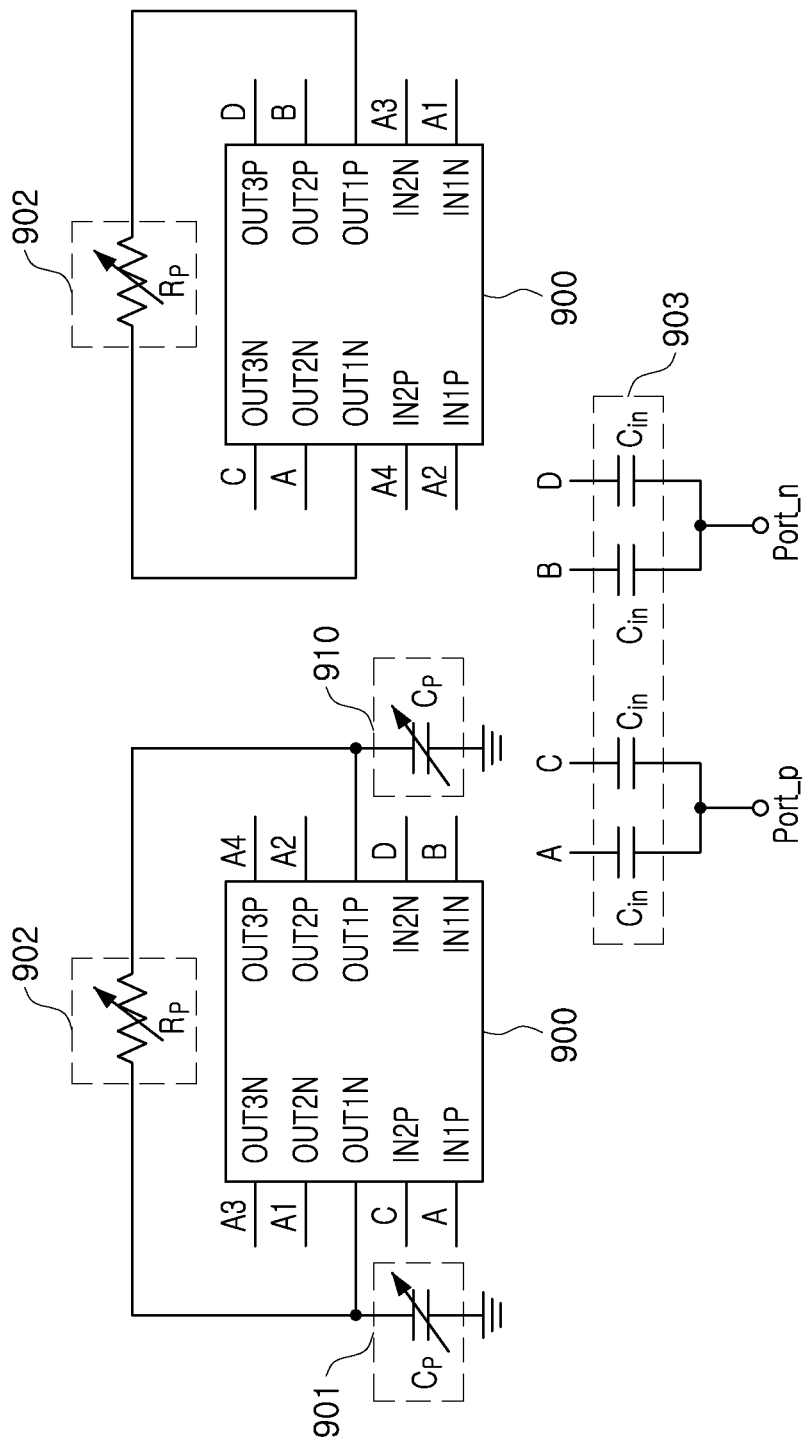
FIG. 9 is a view showing a configuration of an active inductor according to an exemplary embodiment of the present invention.

FIG. 9 is a view showing a configuration of an active inductor according to an exemplary embodiment of the present invention.

With reference to FIG. 9, the active inductor according to the present exemplary embodiment of the present invention may be configured to include first and second amplification cells 900 having an improved linearity, a plurality of load resistors 902, i.e., tuning elements, and a plurality of capacitors 901. Also, the active inductor may further include a bypass capacitor 903 provided at input/output signal terminals.

The first and second amplification cells 900 having an improved linearity are configured to include main and auxiliary amplifying units using an MGTR and a negative resistance unit having an independent biasing unit. Details of which have been described above, so a repeated description thereof will be omitted.

Figure 3A:
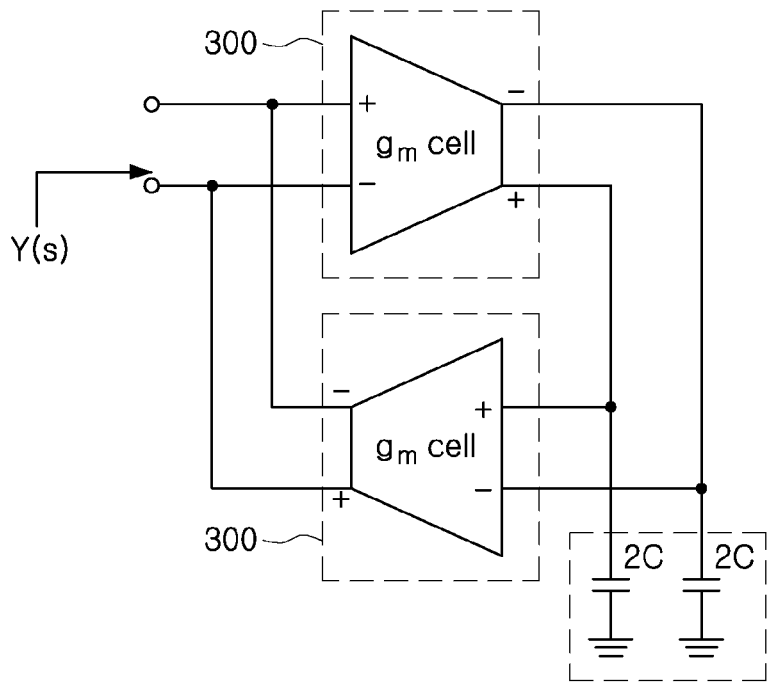
FIGS. 3A and 3B shows structures of a related art active inductor.
Figure 3B:
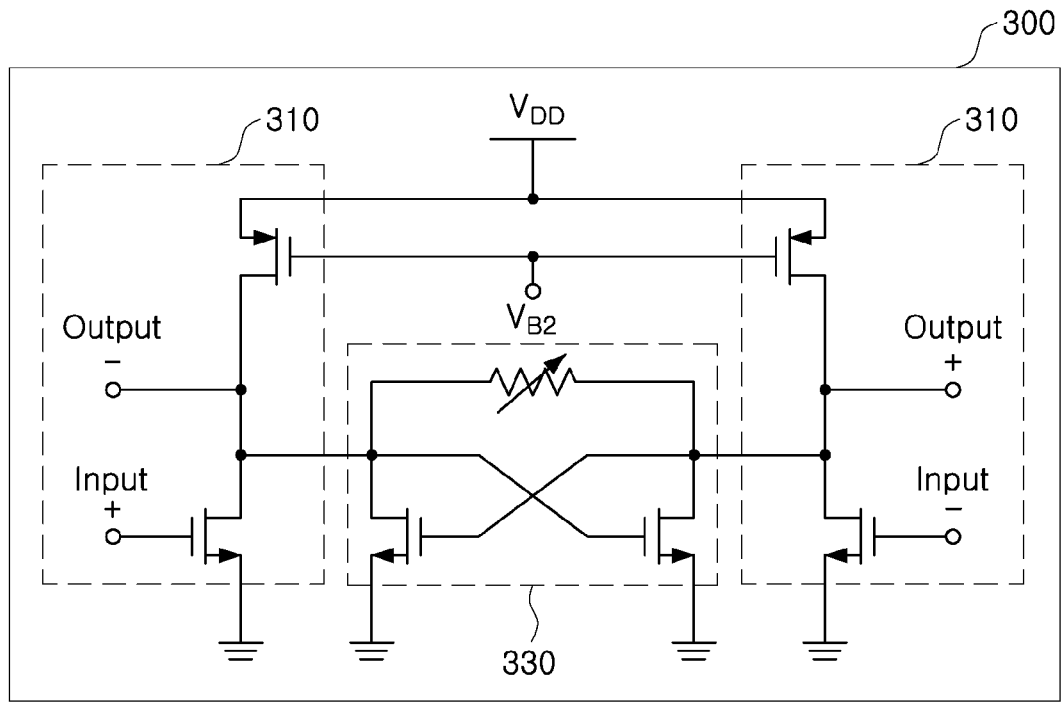

With reference to FIG. 9, outputs OUT2P, OUT3P, OUT2N, and OUT3N of the first amplification cell 900 are connected to inputs IN2P, and IN3P, IN2N, IN3N of the second amplification cell 900. Namely, like the active inductor illustrated in FIG. 3, the first and second active cells 900 are connected.

Values of the plurality of load resistors 902 and the plurality of capacitors 901 are determined according to the characteristics of the active inductor. Also, in order to allow the active inductor to have a wide tuning range, preferably, the plurality of load resistors 902 and the plurality of capacitors 901 are implemented as variable resistors and variable capacitors.

In order to maintain the linearity of the active inductor, the input/output signal terminals (Port_p, Port_n) are divided into four input/output terminals A, B, C, and D for the first and second amplification units configured as the MGTR, and a bypass capacitor 903 is disposed at the input/output terminals to prevent sharing of the DC current.

Figure 10:
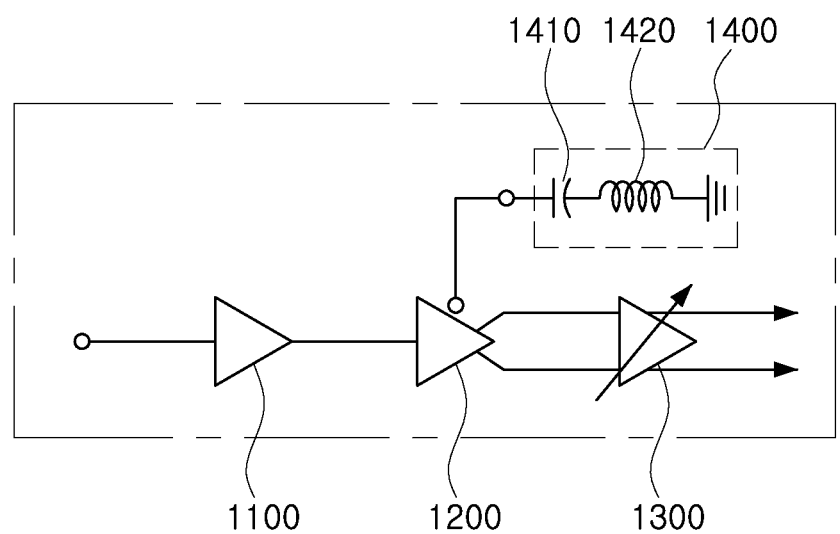
FIG. 10 is a view showing a notch filter implemented by using the active inductor according to an exemplary embodiment of the present invention.

FIG. 10 is a view showing an RF reception unit implemented by using the active inductor according to an exemplary embodiment of the present invention.

With reference to FIG. 10, the RF reception unit may include a broadband LNA 1100, an S/D (Single-to-Differential) amplifier 1200, a notch filter 1400, and a variable gain amplifier 1300.

The broadband LNA 1100 and the variable gain amplifier 1300 may be implemented by using the related art configuration.

The S/D amplifier 1200 is connected to the notch filter 1400. The notch filter 1400 regulates a capacitor 1410 and an active inductor 1420 suitably according to a signal to be eliminated to tune a center frequency to eliminate a desired frequency band from the input signal. The active inductor using the amplification cell according to an exemplary embodiment of the present invention is applied to the active inductor 1420. When the notch filter 1400 is not in use, its power is turned off so as not to affect a receiver.

Figure 11A:
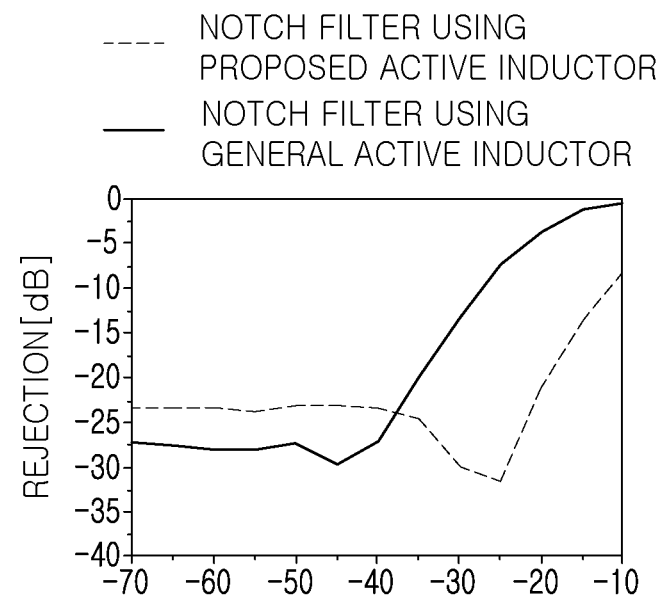
FIGS. 11A, 11B and 11C are graphs showing the characteristics of the notch filter implemented by using the active inductor according to an exemplary embodiment of the present invention.
Figure 11B:
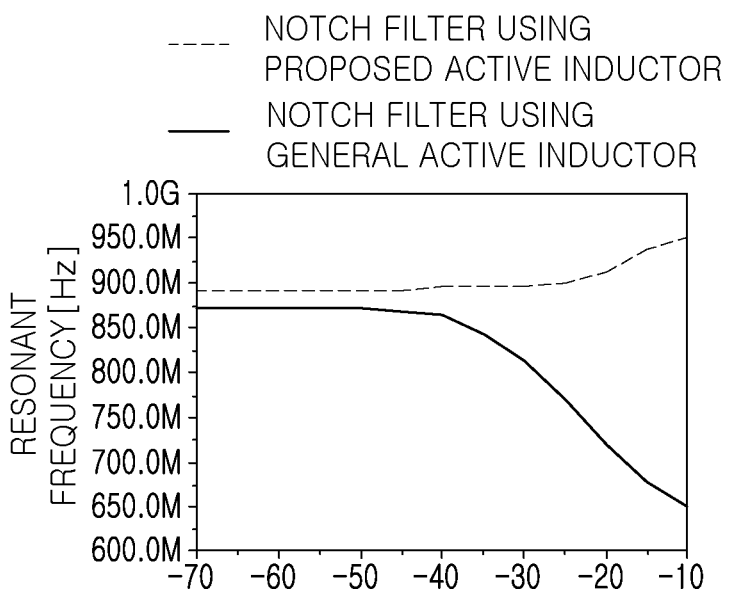
Figure 11C:
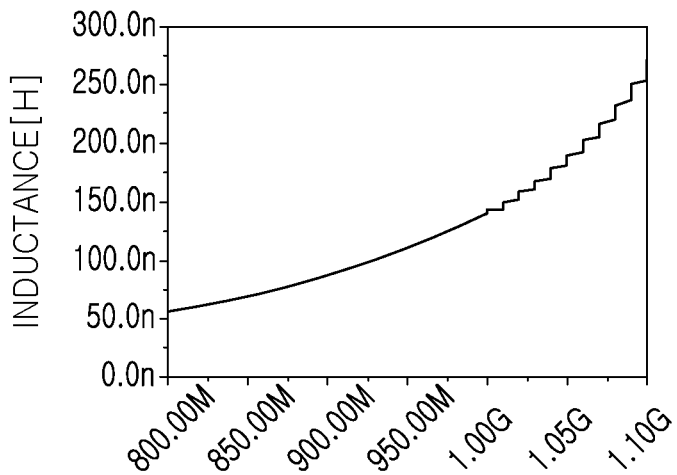

FIGS. 11A, 11B and 11C are graphs showing the characteristics of the notch filter implemented by using the active inductor according to an exemplary embodiment of the present invention.

FIG. 11A is a graph showing a change in an elimination rate over the amplitude of an input signal. It is noted that when the active inductor according to an exemplary embodiment of the present invention is used, the performance of the active inductor is maintained with respect to an input signal having a higher power level compared with the case of using the general active inductor.

FIG. 11B is a graph showing a change in a resonant frequency over the amplitude of an input signal. In case of using the general active inductor, when input power is large, the resonant frequency is drastically dropped. Comparatively, in case of using the active inductor according to an exemplary embodiment of the present invention, even when power of the input signal is large, the size of the resonant frequency is scarcely changed. Thus, it can be noted that the inductance value of the active inductor according to an exemplary embodiment of the present invention is substantially uniformly maintained although the amplitude of the input signal is increased.

FIG. 11C is a graph showing a change in inductance over the frequency of the active inductors. Because the frequency range used by a filter is 90 MHz or some, the active inductor was designed to have inductance of approximately 85 nH according to the frequency range. The graph of FIG. 11C shows a change in the inductance of the thusly designed active inductor.

As set forth above, in the amplification cell and the active inductor using the same according to exemplary embodiments of the invention, because the negative resistor and amplifier having high linearity are designed by employing a linearization scheme, the active inductor having high linearity can be fabricated on a small area.

In addition, an inductor having a high Q-factor and high tuning coverage can be implemented.

While the present invention has been shown and described in connection with the exemplary embodiments, it will be apparent to those skilled in the art that modifications and variations can be made without departing from the spirit and scope of the invention as defined by the appended claims.

What is claimed is:

1. An amplification cell comprising:
a main amplifying unit amplifying an input signal;
an auxiliary amplifying unit connected in parallel to the main amplifying unit and eliminating nonlinear characteristics of the main amplifying unit while amplifying the input signal; and
a negative load unit connected to an output terminal of the main amplifying unit and that of the auxiliary amplifying unit.

2. The amplification cell of claim 1, wherein the negative load unit comprises first and second inverting amplifiers, an output signal from the first inverting amplifier is fed back to an input of the second inverting amplifier, and an output signal from the second inverting amplifier is fed back as an input to the first inverting amplifier.

3. The amplification cell of claim 2, wherein the negative load unit comprises first and second biasing units biasing the first and second inverting amplifiers, and the first and second biasing units operate independently.

4. The amplification cell of claim 3, wherein the negative load unit further comprises first and second DC component eliminators, wherein the first DC component eliminator is disposed at a path for feeding back the output from the first inverting amplifier to the second inverting amplifier, and the second DC component eliminator is disposed at a path for feeding back the output from the second inverting amplifier to the first inverting amplifier.

5. The amplification cell of claim 4, wherein the first and second DC component eliminators comprise a bypass capacitor, respectively.

6. The amplification cell of claim 2, wherein the first and second inverting amplifiers are implemented to have a push-pull structure.

7. The amplification cell of claim 1, wherein the main amplifying unit, the auxiliary amplifying unit, and the negative load unit are implemented as differential circuits.

8. An active inductor comprising:
first and second amplification cells each including a main amplifying unit amplifying an input signal, an auxiliary amplifying unit connected in parallel to the main amplifying unit and eliminating nonlinear characteristics of the main amplifying unit while amplifying the input signal, and a negative load unit connected to an output terminal of the main amplifying unit and that of the auxiliary amplifying unit;
a plurality of load resistors for tuning frequency; and
a plurality of capacitors for tuning frequency,
wherein an output from the first amplification cell is negatively fed back to the second amplification cell, an output from the second amplification cell is negatively fed back to the first amplification cell, and the plurality of load resistors and the plurality of capacitors are disposed on negative feedback paths of the first and second amplification cells.

9. The active inductor of claim 8, wherein the negative load unit comprises first and second inverting amplifiers, an output signal from the first inverting amplifier is fed back to an input of the second inverting amplifier, and an output signal from the second inverting amplifier is fed back as an input to the first inverting amplifier.

10. The active inductor of claim 9, wherein the negative load unit comprises first and second biasing units biasing the first and second inverting amplifiers, and the first and second biasing units operate independently.

11. The active inductor of claim 10, wherein the negative load unit further comprises first and second DC component eliminators, wherein the first DC component eliminator is disposed at a path for feeding back the output from the first inverting amplifier to the second inverting amplifier, and the second DC component eliminator is disposed at a path for feeding back the output from the second inverting amplifier to the first inverting amplifier.

12. The active inductor of claim 11, wherein the first and second DC component eliminators comprise a bypass capacitor, respectively.

13. The active inductor of claim 10, wherein the first and second inverting amplifiers are implemented to have a push-pull structure.

14. The amplification cell of claim 8, wherein the main amplifying unit, the auxiliary amplifying unit, and the negative load unit are implemented as differential circuits.

15. The amplification cell of claim 8, wherein the plurality of capacitors are variable capacitors.

16. The amplification cell of claim 8, wherein a terminal and a bypass capacitor are additionally disposed at the negative feedback paths of the amplification cells.

\* \* \* \* \*